(12) United States Patent
Shinji et al.

(10) Patent No.: US 6,274,524 B1
(45) Date of Patent: *Aug. 14, 2001

(54) SEMICONDUCTIVE ZIRCONIA SINTERING BODY AND ELECTROSTATIC REMOVING MEMBER CONSTRUCTED BY SEMICONDUCTIVE ZIRCONIA SINTERING BODY

(75) Inventors: Mikaki Shinji; Hamashima Hiroshi; Iwasaki Koichi; Iwamoto Kuniharu; Nakahara Masahiro, all of Kagoshima; Okumura Masahiro; Hino Shouji, both of Shiga; Nabeshima Yutaka, Aichi, all of (JP)

(73) Assignee: Kyocera Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/214,049

(22) PCT Filed: Apr. 22, 1998

(86) PCT No.: PCT/JP98/01882

§ 371 Date: Dec. 24, 1998

§ 102(e) Date: Dec. 24, 1998

(87) PCT Pub. No.: WO98/49121

PCT Pub. Date: Nov. 5, 1998

(30) Foreign Application Priority Data

| Apr. 25, 1997 | (JP) | 9-109159 |
| Apr. 25, 1997 | (JP) | 9-109855 |
| Jun. 30, 1997 | (JP) | 9-174856 |
| Aug. 29, 1997 | (JP) | 9-235270 |
| Oct. 30, 1997 | (JP) | 9-299185 |
| Mar. 31, 1998 | (JP) | 10-086299 |

(51) Int. Cl.[7] ............................. C04B 35/48

(52) U.S. Cl. ............................. 501/103; 501/105

(58) Field of Search .................. 501/103, 104, 501/105

(56) References Cited

U.S. PATENT DOCUMENTS

| 3,607,323 | * | 9/1971 | Tedmon . |
| 5,326,519 | * | 7/1994 | Claussen ............... 264/65 |
| 5,711,906 | * | 1/1998 | Briod .................... 264/63 |

FOREIGN PATENT DOCUMENTS

| 0177062 | * | 4/1986 | (EP) . |
| 902493 | * | 3/1999 | (EP) . |
| 0118709 | * | 11/1974 | (JP) . |
| 61071402 |   | 4/1986 | (JP) . |
| 62025404 |   | 2/1987 | (JP) . |
| 63185857 | * | 8/1988 | (JP) . |
| 2000064 |   | 1/1990 | (JP) . |

(List continued on next page.)

OTHER PUBLICATIONS

"Influence of NiO on phase stabilization in 6 mol % Yttria stablized zirconia" Kuzjukevics et al, Mater Sci., Eng, A (1997), A232 (1–2) p 163–167.*

*Primary Examiner*—Paul Marcantoni
(74) *Attorney, Agent, or Firm*—Hogan & Hartson L.L.P.

(57) ABSTRACT

The invention provides a semiconductive zirconia sintering body able to be manufactured simply and cheaply and escape static electricity at suitable speed without greatly reducing mechanical characteristics of zirconia.

10 to 40 weight % of one kind or more of oxides of Fe, Co, Ni and Cr as conductivity giving agents is included with respect to 60 to 90 weight % of $ZrO_2$ including a stabilizing agent so that a semiconductive zirconia sintering body having a volume specific resistance value from $10^5$ to $10^9$ $\Omega \cdot cm$ is formed.

1 Claim, 8 Drawing Sheets

FOREIGN PATENT DOCUMENTS

| | | |
|---|---|---|
| 2068359 | 5/1990 | (JP) . |
| 2304773 | 12/1990 | (JP) . |
| 3005363 | 1/1991 | (JP) . |
| 04092857 * | 3/1992 | (JP) . |
| 6314721 | 11/1994 | (JP) . |
| 07257979 * | 10/1995 | (JP) . |
| 8039441 | 2/1996 | (JP) . |
| 8152020 | 6/1996 | (JP) . |
| 0421674 * | 8/1974 | (SU) . |

* cited by examiner (a)

(b)

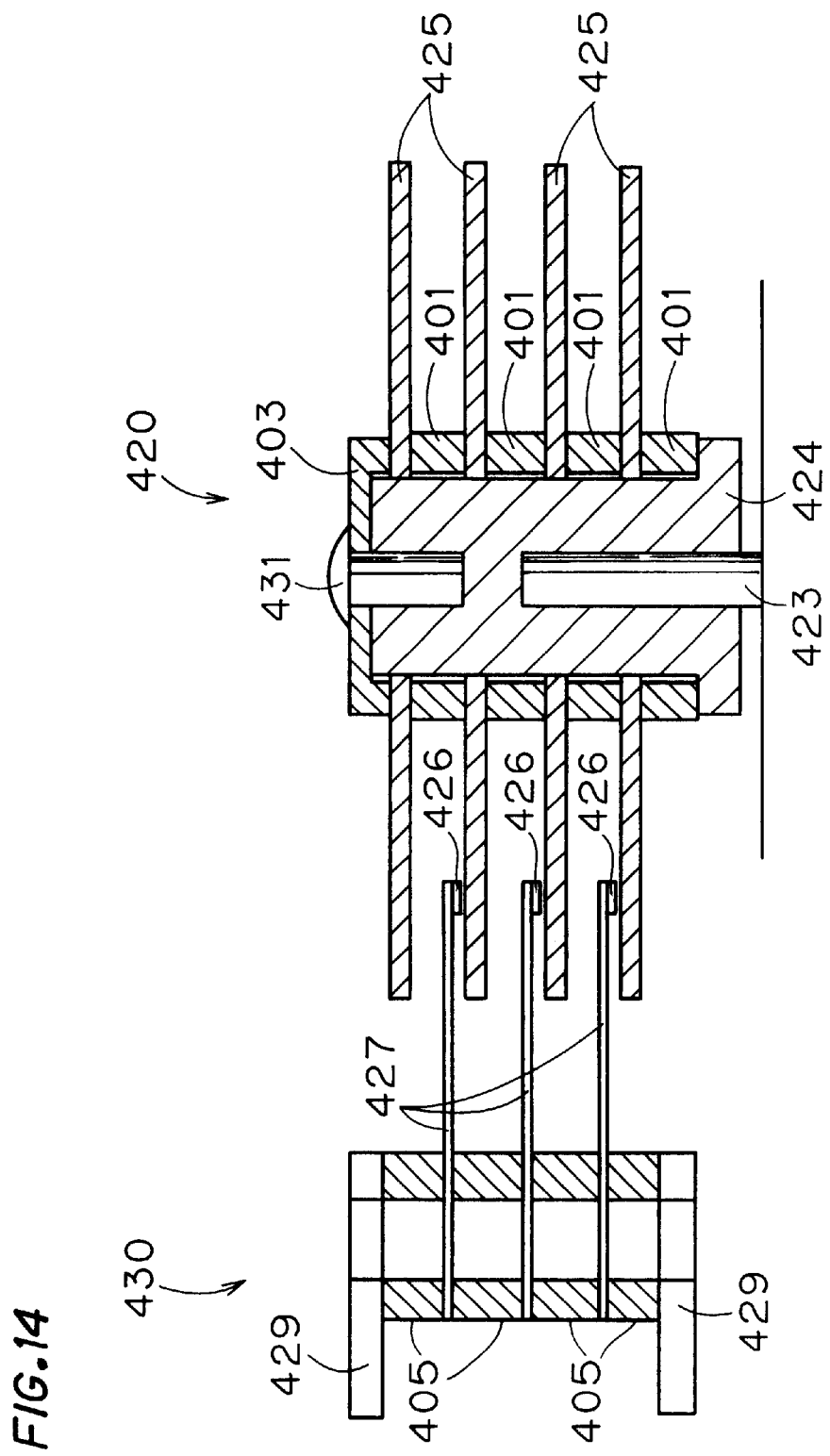

SEMICONDUCTIVE ZIRCONIA SINTERING BODY AND ELECTROSTATIC REMOVING MEMBER CONSTRUCTED BY SEMICONDUCTIVE ZIRCONIA SINTERING BODY

BACKGROUND OF THE INVENTION

The present invention relates to a zirconia sintering body having a semiconductive property while high strength of the zirconia sintering body is maintained, and concretely suitable for uses in which it is necessary to remove static electricity from jigs and tools used in manufacturing processes of a semiconductor device, a magnetic head, electronic parts, etc. and separating claws, etc. used in a tape guide and an image forming apparatus.

A ceramic sintering body constructed by alumina, zirconia, silicon nitride, silicon carbide, etc. as principal components used as materials of structural parts conventionally has high strength and high hardness and also has an excellent heat resisting property and an excellent anticorrosive property. Accordingly, the ceramic sintering body is used in various fields, but a zirconia sintering body is used in uses requiring particularly excellent mechanical strength and sliding characteristics.

The zirconia sintering body is formed by a high insulating material. Therefore, it is necessary to set a volume specific resistance value (hereinafter, briefly called a resistance value) of the zirconia sintering body to be equal to or smaller than $10^9$ $\Omega\cdot$cm so as to use this zirconia sintering body in uses in which an electrostatic removing action is required in a conveying arm and a pincette for gripping a wafer used in a semiconductor manufacturing device, etc., a separating claw used in an image forming apparatus such as a printer, etc., a tape guide used to convey and guide a tape-shaped body such as a magnetic tape, etc. Therefore, a conductivity giving agent is included on trial in the zirconia sintering body to reduce the resistance value.

For example, Japanese Laid-Open (KOKAI) Patent No. 60-103078 discloses a conductive zirconia sintering body which is mainly constructed by $ZrO_2$ stabilized by $Y_2O_3$ and MgO and includes at least one kind of carbide among carbides such as TiC, TaC, WC, etc. as a conductivity giving agent and has a resistance value from 0.5 to $60\times10^{-3}$ $\Omega\cdot$cm.

However, the resistance value of the above conductive zirconia sintering body is excessively low so that static electricity is removed at once when the static electricity is escaped. Accordingly, a problem exists in that discharge is caused by atmospheric friction with an extra-high voltage. Therefore, for example, there is a fear that recording contents of the magnetic tape are broken when the tape guide is formed by the above zirconia sintering body and the static electricity caused by a sliding movement of the tape guide with respect to the magnetic tape is removed.

When such a zirconia sintering body is manufactured, a special device is also required since a burning operation must be performed in a nonoxidizing atmosphere. Further, a problem exists in that manufacturing cost is increased since a raw material itself of the above conductivity giving agent is expensive.

An object of the present invention is to provide a semiconductive zirconia sintering body able to be burned in an oxidizing atmosphere and able to be cheaply manufactured and escape static electricity at a suitable speed without greatly reducing mechanical characteristics of zirconia.

Therefore, in consideration of the above object, a semiconductive zirconia sintering body of the present invention is characterized in that the semiconductive zirconia sintering body is constructed by 60 to 90 weight % of $ZrO_2$ including a stabilizing agent, and 10 to 40 weight % of one kind or more of oxides of Fe, Co, Ni and Cr as conductivity giving agents and has a volume specific resistance value from $10^5$ to $10^9$ $\Omega\cdot$cm.

Namely, the semiconductive zirconia sintering body of the present invention includes an oxide of one kind or more among oxides of Fe, Co, Ni and Cr as conductivity giving agents. Accordingly, it is found that these conductivity giving agents constitute a grain boundary phase, and the sintering body can have a semiconductive property ranging from $10^5$ to $10^9$ $\Omega\cdot$cm in volume specific resistance value without greatly reducing the strength of zirconia.

Therefore, static electricity can be escaped at a suitable speed. Accordingly, when an object coming in contact with the zirconia sintering body tends to be electrically influenced, the static electricity can be removed from the object without breaking this object.

Further, each of the above conductivity giving agents is constructed by an oxide so that the conductivity giving agents can be burnt in an oxidizing atmosphere. Accordingly, no special device is required to burn the conductivity giving agents. Further, these conductivity giving agents can be cheaply obtained so that the zirconia sintering body can be simply and cheaply manufactured.

However, when a content of the above conductivity giving agents is smaller than 10 weight %, effects for reducing the resistance value are small. Conversely, when this content is greater than 40 weight lo the resistance value is smaller than $10^5$ $\Omega\cdot$cm so that the static electricity tends to be escaped at once. Therefore, there is a fear that discharge is caused by atmospheric friction with an extra-high voltage. Further, mechanical characteristics (flexural strength, fracture toughness value, hardness, etc.) of the sintering body are greatly reduced so that no original mechanical characteristics of zirconia can be shown.

Therefore, it is important to set the content of the conductivity giving agents to 10 to 40 weight % and preferably 20 to 30 weight %.

$ZrO_2$ as a principal component is partially stabilized by a stabilizing agent such as $Y_2O_3$, MgO, CaO, $CeO_2$, etc.

Concretely, when $Y_2O_3$ is used as a stabilizing agent, $Y_2O_3$ is added to $ZrO_2$ in a range from 3 to 9 mol %. When MgO is used as a stabilizing agent, MgO is added to $ZrO_2$ in a range from 16 to 26 mol %. When CaO is used as a stabilizing agent, CaO is added to $ZrO_2$ in a range from 8 to 12 mol %. When $CeO_2$ is used as a stabilizing agent, $CeO_2$ is added to $ZrO_2$ in a range from 10 to 16 mol %. If the stabilizing agents are added in these ranges, a zirconia (tetragonal zirconia and cubic zirconia) amount except for monoclinic zirconia with respect to all zirconia amounts can be set to be equal to or greater than 90%. Therefore, it is possible to restrain a strength addition caused by including the conductivity giving agents and realize a flexural strength equal to or greater than 580 MPa, a high fracture toughness value equal to or greater than 5 MPam$^{1/2}$ and a high Vickers hardness equal to or greater than 9.5 GPa.

Namely, a crystal state of zirconia is constructed by three states composed of cubic, tetragonal and monoclinic states. The tetragonal zirconia is particularly transformed to the monoclinic zirconia in phase by stress induced transformation with respect to external stress. Fine microcracks are formed around the zirconia by volume expansion caused at this time so that progress of the external stress can be prevented. Accordingly, strength of the zirconia sintering body can be increased.

Therefore, if a thin conveying arm and a pincette for gripping a wafer used in a semiconductor manufacturing device, etc., a separating claw used to separate paper from a roller in an image forming apparatus such as a printer, etc., a tape guide, etc. used to convey and guide a tape-shaped body such as a magnetic tape, etc. are formed by this zirconia sintering body, no zirconia sintering body is worn and damaged for a short period so that the zirconia sintering body can be suitably used for a long period.

An average crystal particle diameter of $ZrO_2$ in the zirconia sintering body ranges from 0.3 to 1.0 $\mu m$ and preferably ranges from 0.4 to 0.6 $\mu m$.

An X-ray diffraction intensity of the monoclinic zirconia and X-ray diffraction intensities of the tetragonal zirconia and the cubic zirconia are respectively measured by X-ray diffraction to calculate the zirconia amount except for the monoclinic zirconia with respect to all the zirconia amounts in the zirconia sintering body. This zirconia amount is calculated by the following calculating formula.

$$X_m = 1 - \frac{I_m(111) + I_m(-111)}{I_m(111) + I_m(-111) + I_t(111)} \times 100 \quad \text{[Formula 1]}$$

$X_m$: zirconia amount (%) except for monoclinic zirconia with respect to all zirconia amounts $I_m$: X-ray diffraction intensity of monoclinic zirconia $I_t$: X-ray diffraction intensities of tetragonal zirconia+ cubic zirconia Further, there is a fear that $Al_2O_3$, MnO, $SiO_2$, Na, Fe, etc. are mixed as impurities with raw material powder in a manufacturing process. However, these impurities may be included in the raw material powder if these impurities have a weight % equal to or smaller than 2.0.

When such a semiconductive zirconia sintering body is manufactured, $ZrO_2$ powder having an average particle diameter from 0.5 to 1.0 $\mu m$, $Y_2O_3$, MgO, CaO and $CeO_2$ powders as stabilizing agents, and oxide powder of one kind or more among oxides of $Fe_2O_3$, $Co_3O_4$, NiO, $Cr_2O_3$ as conductivity giving agents are used. Otherwise, hydroxide powder, carbonate powder, etc. changeable to these materials during burning are used. $ZrO_2$ including the stabilizing agents and the conductivity giving agents are adjusted such that this $ZrO_2$ has 60 to 90 weight % and the conductivity giving agents have 10 to 40 weight %. These materials are mixed with each other by a dry or wet type. In the case of the wet type, granules can be also made by drying these materials by a spray drier, etc.

A die is filled with the raw material powder formed by the dry type and the granules formed by the wet type. The raw material powder and the granules are then molded in a predetermined shape by a well-known molding means such as a mechanical press molding method, a rubber press molding method, etc. Otherwise, a slurry formed by the wet type is molded in a predetermined shape by a well-known molding means such as an extrusion molding method, an injection molding method, a tape molding method, etc. Thereafter, the molded slurry is burnt for about one to three hours in an oxidizing atmosphere. At this time, when a burning temperature is lower than 1360° C., no molded slurry can be perfectly sintered. In contrast to this, when the burning temperature is higher than 1450° C., sinter over is caused. Accordingly, strength and hardness of the zirconia sintering body can be increased in each of these cases. Therefore, it is important to burn the molded slurry at a temperature from 1360 to 1450° C.

When the zirconia sintering body is manufactured in such a condition, it is possible to obtain a semiconductive zirconia sintering body in which the zirconia amount except for the monoclinic zirconia with respect to all the zirconia amounts is 90% or more, and the flexural strength is 580 MPa or more, and the fracture toughness value is 5 $MPam^{1/2}$ or more and the Vickers (Hv) hardness is 9.5 GPa or more, and the volume specific resistance value ranges from $10^5$ to $10^9$ $\Omega \cdot cm$.

A coprecipitation method may be used when $ZrO_2$ and the stabilizing agents are mixed with each other. If this coprecipitation method is used, it is possible to obtain $ZrO_2$ in which the stabilizing agents are dispersed finely and uniformly.

BRIEF DESCRIPTION OF THE DRAWINGS

FIG. 14 is a longitudinal sectional view of a magnetic recorder in the present invention.

EMBODIMENTS

Figure 1:
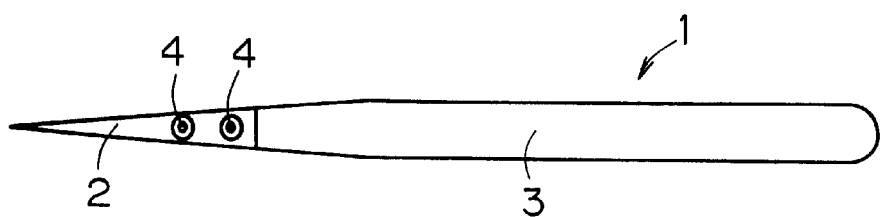
FIG. 1 is a view showing one embodiment mode of a gripper in accordance with the present invention in which FIG. 1(*a*) is a front view of this gripper and FIG. 1(*b*) is a side view of this gripper.
Figure 1:
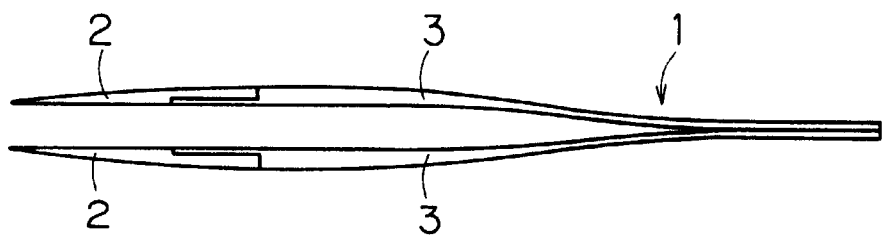

The embodiment modes of the present invention will next be described. 3 mol % of $Y_2O_3$ powder is added to $ZrO_2$ powder having an average particle diameter of 0.6 μm, and 30 weight % of $Fe_2O_3$ powder as a conductivity giving agent is also added to this $ZrO_2$ powder. Further, a binder and a solvent are added to this $ZrO_2$ powder and these materials are kneaded and dried so that granules are manufactured. A die is then filled with these granules and the granules are molded in a predetermined shape at a press pressure of 1.0 ton/cm² by a mechanical press molding method. Thereafter, the granules are burnt for about two hours in the atmosphere at 1390° C. so that a zirconia sintering body is obtained.

With respect to this zirconia sintering body, an X-ray diffraction intensity of monoclinic zirconia and X-ray diffraction intensities of tetragonal zirconia and cubic zirconia are respectively measured by X-ray diffraction. A zirconia amount except for the monoclinic zirconia with respect to all zirconia amounts is calculated from the above calculating formula so that 99% of this zirconia amount is constructed by zirconia except for the monoclinic zirconia.

The above zirconia sintering body is cut in a prismatic shape of 3 mm×4 mm×50 mm. Thereafter, a sample is manufactured by polishing a surface of this zirconia sintering body such that a central line average roughness (Ra) is 0.1 μm. A flexural strength and a fracture toughness value of this sample are measured by a three-point bending test based on JIS (Japanese Industrial Standard) R1601 so that the flexural strength is 843 MPa and the fracture toughness value is 5.6 $MPam^{1/2}$.

Another sample is also prepared and Vickers hardness (Hv) of this sample is measured so that this Vickers hardness is 11.3 GPa. Further, a volume specific resistance value of a still another sample is measured by a four-terminal method so that this volume specific resistance value is $2.0×10^6$ Ω·cm.

Therefore, the zirconia sintering body formed in a prismatic shape of 2.5 mm×6 mm×40 mm is prepared to know a removing degree of static electricity. A voltage of 1000 V is applied to one end of this zirconia sintering body and a voltage dropping time is measured until a voltage value at the other end of the zirconia sintering body is reduced to 100 V. The voltage dropping time ranges from 0.1 to 20 seconds. Accordingly, the static electricity can be escaped at a suitable speed without causing any discharge by atmospheric friction so that the zirconia sintering body is preferable.

Embodiment 1

Mechanical characteristics (flexural strength, fracture toughness value, Vickers hardness) and electric characteristics (volume specific resistance value and removing degree of static electricity) of the zirconia sintering body in the above embodiment mode are measured when the content of $Fe_2O_3$ as a conductivity giving agent is changed. The mechanical characteristics and the electric characteristics are measured by a method similar to that in the above embodiment mode.

The measured results are shown in the following table 1.

TABLE 1

| No. | Composition ratio of sintering body | | | Burning temperature (° C.) | Flexural strength (MPa) | Fracture toughness value MPam½ | Vickers hardness (GPa) | Volume specific resistance value Ω · cm | Electrostatic removing degree |
|---|---|---|---|---|---|---|---|---|---|
| | $ZrO_2$ (Wt %) | $Fe_2O_3$ (Wt %) | ① (%) | | | | | | |
| ✕1 | 95 | 5 | 100 | 1460 | 1176 | 6.1 | 12.5 | $10^{14}$ | x |
| ✕2 | 92 | 8 | 99.6 | 1450 | 1098 | 6.1 | 12.5 | $10^{10}$ | x |
| 3 | 90 | 10 | 99.5 | 1450 | 1069 | 6.0 | 12.5 | $10^9$ | ○ |
| 4 | 80 | 20 | 99.0 | 1420 | 922 | 6.0 | 12.3 | $10^7$ | ○ |
| 5 | 70 | 30 | 99.0 | 1390 | 843 | 5.6 | 11.3 | $10^6$ | ○ |
| 6 | 60 | 40 | 93.7 | 1360 | 688 | 5.4 | 9.9 | $10^5$ | ○ |
| ✕7 | 55 | 45 | 84.2 | 1340 | 639 | 5.4 | 9.2 | $10^4$ | x |
| ✕8 | 50 | 50 | 72.5 | 1325 | 590 | 5.3 | 8.8 | $10^4$ | x |

✕Shows samples outside the scope of the present invention.
① Zirconia amount except for monoclinic zirconia with respect to all zirconia amounts As a result, sample Nos. 1 and 2 having a content of $Fe_2O_3$ smaller than 10 weight % have excellent mechanical characteristics of zirconia, but have a volume specific resistance value equal to or greater than $10^{10}$ Ω·cm. Accordingly, each of the sample Nos. 1 and 2 has a high insulating property so that no removing effects of the static electricity can be obtained.

Sample Nos. 7 and 8 having a content of $Fe_2O_3$ greater than 40 weight % have reduced mechanical characteristics, but has a flexural strength 580 MPa or more, a fracture toughness value 5 $MPam^{1/2}$ or more, and a Vickers hardness (Hv) 9.5 GPa or more. However, since the content of $Fe_2O_3$ is excessively large, the volume specific resistance value is reduced to $10^4$ Ω·cm. As a result, a problem exists in that the static electricity is escaped at once.

In contrast to this, each of sample Nos. 3 to 6 having a content of $Fe_2O_3$ ranging from 10 to 40 weight % has a flexural strength 580 MPa or more, a fracture toughness value 5 $MPam^{1/2}$ or more, and a Vickers hardness (Hv) 9.5 CPa or more. Accordingly, each of these sample Nos. 3 to 6 has excellent mechanical characteristics.

Further, since the volume specific resistance can be set to range from $10^5$ to $10^9$ Ω·cm, the static electricity can be escaped at a suitable speed so that the electrostatic removing effects are excellent.

As a result, it should be understood that a semiconductive zirconia sintering body having excellent electrostatic removing effects is obtained without greatly reducing the mechanical characteristics of zirconia if $Fe_2O_3$ as a conductivity giving agent is included in a range from 10 to 40 weight %.

Embodiment 2

Next, zirconia sintering bodies using NiO, $Co_3O_4$, $Cr_2O_3$ as other conductivity giving agents are manufactured on trial and their mechanical and electrical characteristics are measured by a method similar to that in the above embodiment mode.

The respective measured results are shown in the following table 2.

TABLE 2

| No. | Composition ratio of sintering body | | ① (%) | Burning temperature (° C.) | Flexural strength (MPa) | Fracture toughness value MPam½ | Vickers hardness (GPa) | Volume specific resistance value Ω · cm | Electro-static removing degree |
|---|---|---|---|---|---|---|---|---|---|
| | $ZrO_2$ (Wt %) | Conductivity giving agent (Wt %) | | | | | | | |
| 9 | 90 | NiO: 10 | 99.3 | 1450 | 1036 | 5.9 | 12.3 | $10^9$ | ○ |
| 10 | 60 | NiO: 40 | 92.9 | 1360 | 712 | 5.3 | 9.7 | $10^5$ | ○ |
| 11 | 90 | CoO: 10 | 99.0 | 1450 | 968 | 6.0 | 12.0 | $10^8$ | ○ |
| 12 | 60 | CoO: 40 | 94.1 | 1360 | 590 | 5.2 | 9.6 | $10^5$ | ○ |
| 13 | 90 | $Cr_2O_3$: 10 | 99.2 | 1450 | 1011 | 5.9 | 12.1 | $10^9$ | ○ |
| 14 | 60 | $Cr_2O_3$: 40 | 91.9 | 1360 | 642 | 5.4 | 9.6 | $10^8$ | ○ |

① Zirconia amount except for monoclinic zirconia with respect to all zirconia amounts As a result, when NiO, $Co_3O_4$ and $Cr_2O_3$ are used as conductivity giving agents, it should be understood that a semiconductive zirconia sintering body having excellent electrostatic removing effects is obtained without greatly reducing the mechanical characteristics of zirconia if contents of these conductivity giving agents are set to range from 10 to 40 weight %.

$Co_3O_4$ added as a conductivity giving agent exists in a state of CoO in the sintering body.

As mentioned above, the semiconductive zirconia sintering body of the present invention is constructed by 60 to 90 weight % of $ZrO_2$ including a stabilizing agent and 10 to 40 weight % of an oxide of one kind or more among oxides of Fe, Co, Ni and Cr as conductivity giving agents. Further, the volume specific resistance value of this semiconductive zirconia sintering body is set to range from $10^5$ to $10^9$ Ω·cm. Accordingly, the static electricity can be escaped at a suitable speed without greatly reducing the mechanical characteristics of zirconia. Therefore, if a conveying arm and a pincette for gripping a wafer used in a semiconductor manufacturing device, a separating claw used in an image forming apparatus such as a printer, etc., a tape guide, etc. used to convey and guide a tape-shaped body such as a magnetic tape, etc. are formed by this semiconductive zirconia sintering body, no semiconductive zirconia sintering body is badly influenced by the static electricity and is worn and damaged for a short period so that the semiconductive zirconia sintering body can be suitably used for a long period.

Further, since the above semiconductive zirconia sintering body can be burnt in an oxidizing atmosphere, no special device is required and raw materials themselves of the conductivity giving agents used in the present invention can be cheaply obtained so that the semiconductive zirconia sintering body can be provided simply and cheaply.

As mentioned above, the semiconductive zirconia sintering body of the present invention can escape the static electricity at a suitable speed and can be used as an electrostatic removing member for preventing charge of the static electricity. For example, this electrostatic removing member is constructed by a gripper, a magnetic head processing assembly jig, a dynamic pressure bearing, a wire bonding tool, a substrate holding member, etc. as shown below.

FIG. 1 is a view showing one embodiment mode of the gripper 1 in the present invention. FIG. 1(a) is a front view of the gripper 1 and FIG. 1(b) is a side view of the gripper 1. A pair of gripping portions 2 having sharp end tips are formed by nonmagnetic partially stabilized zirconia ceramics having a flexural strength 700 MPa or more and a volume specific resistance value (hereinafter, called a resistance value) from $10^6$ to $10^9$ Ω·cm. The gripping portions 2 are respectively joined to end tips of a pair of gripping members 3 through screws 4. The gripper members 3 are joined to each other in their rear end portions and are constructed by a resilient material. In the gripper 1 shown in FIG. 1, the gripping portions 2 are join ed to the gripping members 3 through the screws 4 as an example, but may be joined to the gripping members 3 by a conductive adhesive. Further, engaging convex portions may be formed in the gripping portions 2 and engaging concave portions may be also formed in the gripping members 3 so that both the convex and concave portions are engaged and fixed to each other. Further, the gripping members 3 can be formed by bending an elongated plate-shaped body constructed by a metal, etc. in a U-shape or a V-shape.

When an unillustrated gripped object is gripped by this gripper 1, each gripping member 3 is resiliently deformed if pressing force is manually applied to the gripping member 3. Accordingly, the gripped object is gripped by the gripping portions 2 respectively fixed to the end tips of the gripping portions 3.

The flexural strength of the partially stabilized zirconia ceramics constituting the gripping portions 2 is set to 700 MPa or more since a large bending stress is applied to the gripping portions 2 every time the gripped object is gripped. When shapes of the gripping portions 2 are particularly sharpened as shown in FIG. 1, the gripping portions 2 are damaged by the bending stress if the flexural strength is smaller than 700 MPa.

The resistance value of the partially stabilized zirconia ceramics is set to range from $10^6$ to $10^9$ Ω·cm since an insulating property is high and no electrostatic removing effects can be obtained when the resistance value is greater than $10^9$ Ω·cm. Conversely, when the resistance value is smaller than $10^6$ Ω·cm, the static electricity stored to the gripping portions 2 is escaped at once so that no occurrence of a discharging action caused by atmospheric friction can be prevented.

Accordingly, when suitable conductivity is provided by setting the resistance value to range from $10^6$ to $10^9$ Ω·cm, the static electricity can be gradually escaped so that the static electricity can be removed without causing any treating defective accident by a conductive short circuit.

Further, since the above partially stabilized zirconia ceramics are set to be nonmagnetic, no zirconia ceramics are magnetically charged so that parts of a semiconductor device, an MR head, etc. or electronic parts, etc. are not badly influenced by the gripper when a gripped object such as these parts and electronic parts, etc. is gripped by the gripper.

In such nonmagnetic partially stabilized zirconia ceramics having a flexural strength of 700 MPa or more and a volume specific resistance value from $10^6$ to $10^9$ Ω·cm, one kind or more of $Fe_2O_3$, $Cr_2O_3$, NiO and $Co_3O_4$ are included as conductivity giving agents in a range from 10 to 35 weight %, or a carbide of one kind or more of TiC, WC, TaC, etc. is included in a range from 10 to 25 weight %. Further, the remaining portion of the zirconia ceramics is constructed by zirconia partially stabilized by a stabilizing agent such as $Y_2O_3$, CaO, MgO, $CeO_2$, etc. Furthermore, a zirconia amount except for monoclinic zirconia with respect to all zirconia amounts in a sintering body is set to 90% or more, and is preferably set to 95% or more.

Embodiment

The gripper 1 of FIG. 1 having the gripping portions 2 constructed by partially stabilized zirconia ceramics having a different flexural strength, a different volume specific resistance value, a different Vickers hardness and a different residual magnetic flux density is made on trial by changing contents of the conductivity giving agents. Existence or nonexistence of a damage of the gripping portions 2, a removing degree of static electricity and nonmagnetism are then measured.

In this experiment, a gripped object having a width of 0.2 mm and a thickness of 0.5 mm in a thinnest portion in each of the gripping portions 2 is gripped by each gripper 1. At this gripping time, mark X shows that end tips of the gripping portions 2 are chipped. Mark ○ shows that no end tips of the gripping portions 2 are chipped. Existence and nonexistence of the damage of the gripping portions 2 are evaluated by using these marks.

With respect to the removing degree of the static electricity, a voltage of 1000 V is applied to the gripping portions 2 and a voltage of the gripping member 3 and its dropping time are measured by the gripping member 3. Mark ○ shows that the dropping time ranges from 0.1 to 20 seconds until the voltage value of the gripping member 3 is reduced to 100 V. Mark X shows a range except for this range.

Further, nonmagnetism is evaluated by measuring a residual magnetic flux density by a vibrational test type magnetometer. In this evaluation, nonmagnetism shows that the residual magnetic flux density is equal to or smaller than 14 gauss.

Table 3 shows a composition of the partially stabilized zirconia ceramics constituting each gripping portion 2. Table 4 shows characteristics and evaluated results of these partially stabilized zirconia ceramics.

The above partially stabilized zirconia ceramics are partially stabilized by adding 3 mol % of $Y_2O_3$ to $ZrO_2$ and $Fe_2O_3$, $Cr_2O_3$, NiO, $Co_3O_4$, TiC, WC and TaC are used for conductivity giving agents. Further, stainless steel (SUS304) is used as a material of the gripping member 3.

TABLE 3

| Sample No. | Composition of partially stabilized zirconia ceramics (weight %) | | | | | | | | |
|---|---|---|---|---|---|---|---|---|---|
| | $ZrO_2$ | $Fe_2O_3$ | NiO | $Co_3O_4$ | $Cr_2O_3$ | TiC | WC | TaC | Others |
| ✕1 | 88 | 7 | — | — | — | — | — | — | 5 |
| 2 | 88 | 11 | — | — | — | — | — | — | 1 |
| 3 | 85 | 15 | — | — | — | — | — | — | — |
| 4 | 69 | 30 | — | — | — | — | — | — | 1 |
| 5 | 65 | 34 | — | — | — | — | — | — | 1 |
| ✕6 | 60 | 38 | — | — | — | — | — | — | 2 |
| ✕7 | 60 | 40 | — | — | — | — | — | — | — |
| 8 | 84 | — | 13 | — | — | — | — | — | 3 |
| 9 | 67 | — | 30 | — | — | — | — | — | 3 |
| 10 | 87 | — | — | 12 | — | — | — | — | 1 |
| 11 | 66 | — | — | 33 | — | — | — | 1 | — |
| 12 | 84 | — | — | — | 15 | — | — | — | 1 |
| 13 | 69 | — | — | — | 30 | — | — | — | 1 |
| ✕14 | 91 | — | — | — | — | 7 | — | — | 2 |
| 15 | 87 | — | — | — | — | 11 | — | — | 2 |
| 16 | 75 | — | — | — | — | 23 | — | — | 2 |
| ✕17 | 71 | — | — | — | — | 27 | — | — | 2 |
| 18 | 84 | — | — | — | — | — | 15 | — | 1 |
| 19 | 74 | — | — | — | — | — | 25 | — | 1 |
| 20 | 85 | — | — | — | — | — | — | 12 | 3 |
| 21 | 77 | — | — | — | — | — | — | 20 | 3 |

✕Shows samples outside the scope of the present invention.

TABLE 4

| Sample No. | $ZrO_2$ amount except for monoclinic zirconia with respect to all zirconia amounts (mol %) | Flexural strength (MPa) | Vickers hardness (GPa) | Existence of damage of gripper | Volume specific resistance value ($\Omega \cdot cm$) | Electrostatic removing effects | Residual magnetic flux (gauss) |
|---|---|---|---|---|---|---|---|
| ※1 | 96 | 940 | 12.0 | ○ | $10^{10}$ | x | Nonmagnetisin |
| 2 | 98 | 850 | 11.9 | ○ | $10^9$ | ○ | Nonmagnetism |
| 3 | 97 | 900 | 11.5 | ○ | $10^9$ | ○ | Nonmagnetism |
| 4 | 95 | 750 | 11.3 | ○ | $10^7$ | ○ | Nonmagnetism |
| 5 | 93 | 700 | 10.8 | ○ | $10^6$ | ○ | Nonmagnetism |
| ※6 | 89 | 580 | 10.7 | x | $10^5$ | x | Magnetism |
| ※7 | 72 | 400 | 10.7 | x | $10^9$ | X | Magnetism |
| 8 | 98 | 900 | 10.9 | ○ | $10^8$ | ○ | Nonmagnetism |
| 9 | 97 | 760 | 10.4 | ○ | $10^8$ | ○ | Nonmagnetism |
| 10 | 96 | 880 | 11.3 | ○ | $10^8$ | ○ | Nonmagnetism |
| 11 | 94 | 700 | 10.7 | ○ | $10^8$ | ○ | Nonmagnetism |
| 12 | 97 | 1000 | 11.7 | ○ | $10^8$ | ○ | Nonmagnetism |
| 13 | 96 | 820 | 10.9 | ○ | $10^7$ | ○ | Nonmagnetism |
| ※14 | 99 | 1250 | 12.6 | ○ | $10^{10}$ | x | Nonmagnetism |
| 15 | 98 | 1100 | 12.7 | ○ | $10^9$ | ○ | Nonmagnetism |
| 16 | 95 | 970 | 12.9 | ○ | $10^6$ | ○ | Nonmagnetism |
| ※17 | 93 | 930 | 12.9 | ○ | $10^5$ | x | Magnetism |
| 18 | 94 | 780 | 12.0 | ○ | $10^5$ | ○ | Nonmagnetism |
| 19 | 92 | 710 | 11.9 | ○ | $10^6$ | ○ | Nonmagnetism |
| 20 | 96 | 790 | 11.6 | ○ | $10^9$ | ○ | Nonmagnetism |
| 21 | 94 | 740 | 10.8 | ○ | $10^7$ | ○ | Nonmagnetism |

※Shows samples outside the scope of the present invention.

As a result, sample Nos. 1 to 7 include $Fe_2O_3$ as a conductivity giving agent. The sample No. 1 among these sample Nos. 1 to 7 has a content of $Fe_2O_3$ smaller than 10 weight % so that the resistance value is greater than $10^9$ $\Omega \cdot cm$. As a result, it takes time until the voltage reaches a predetermined value. Therefore, no electrostatic removing effects can be obtained.

The sample Nos. 6 and 7 have contents of $Fe_2O_3$ greater than 35 weight %, and zirconia amounts of the sample Nos. 6 and 7 except for monoclinic zirconia with respect to all zirconia amounts are smaller than 90% so that the flexural strength is smaller than 700 MPa. Therefore, when the gripped object is gripped, the gripping portions 2 are chipped. Further, since the resistance value is smaller than $10^6$ $\Omega \cdot cm$, the voltage is reduced to the predetermined value for a short time so that static electricity is escaped at once. Further, the sample Nos. 6 and 7 are magnetic since the contents of $Fe_2O_3$ are large.

In contrast to this, sample Nos. 2 to 5 have contents of $Fe_2O_3$ ranging from 10 to 35 weight % and zirconia amounts of these sample Nos. 2 to 5 except for monoclinic zirconia with respect to all zirconia amounts are equal to or greater than 90% so that these sample Nos. 2 to 5 are nonmagnetic and have high flexural strengths equal to or greater than 700 MPa. Further, these sample Nos. 2 to 5 have resistance values ranging from $10^6$ to $10^9$ $\Omega \cdot cm$. Therefore, when the gripped object is gripped, no chipping of the gripping portions 2 is caused and static electricity can be removed at a suitable speed.

In sample Nos. 8 to 13, $Cr_2O_3$, NiO and $Co_3O_4$ are used as conductivity giving agents. These sample Nos. 8 to 13 have contents of these conductivity giving agents ranging from 10 to 35 weight % and zirconia amounts of these sample Nos. 8 to 13 except for monoclinic zirconia with respect to all zirconia amounts are equal to or greater than 90%. Accordingly, these sample Nos. 8 to 13 have high flexural strengths equal to or greater than 700 MPa and resistance values ranging from $10^6$ to $10^9$ $\Omega \cdot cm$. Therefore, when the gripped object is gripped, no chipping of the gripping portions 2 is caused and static electricity can be removed at a suitable speed.

In contrast to this, sample Nos. 14 to 17 include TiC as a conductivity giving agent. The sample No. 14 among these sample Nos. 14 to 17 has a content of TiC smaller than 10 weight % so that a resistance value of this sample No. 14 is greater than $10^9$ $\Omega \cdot cm$. Accordingly, no sufficient electrostatic removing effects of the sample No. 14 can be obtained.

The sample No. 17 has a content of TiC greater than 25 weight % so that a resistance value of this sample No. 17 is smaller than $10^6$ $\Omega \cdot cm$. Accordingly, static electricity is escaped at once. Further, this sample No. 17 is magnetic since the content of TiC is large.

In contrast to this, sample Nos. 15 and 16 have contents of TiC ranging from 10 to 25 weight % and zirconia amounts of these sample Nos. 15 and 16 except for monoclinic zirconia with respect to all zirconia amounts are equal to or greater than 90%. Therefore, the flexural strengths of the sample Nos. 15 and 16 can be set to be equal to or greater than 700 MPa. Further, the resistance values of the sample Nos. 15 and 16 can be set to range from $10^6$ to $10^9$ $\Omega \cdot cm$. Therefore, when the gripped object is gripped, no chipping of the gripping portions 2 is caused and static electricity can be removed at a suitable speed.

In sample Nos. 18 to 21, WC and TaC are used as conductivity giving agents and these sample Nos. 18 to 21 have contents of these conductivity giving agents ranging from 10 to 25 weight %. Zirconia amounts of these sample Nos. 18 to 21 except for monoclinic zirconia with respect to all zirconia amounts are equal to or greater than 90% so that a flexural strength of each of these sample Nos. 18 to 21 can be set to be equal to or greater than 700 MPa and a resistance value of each of these sample Nos. 18 to 21 can be set to range from $10^6$ to $10^9$ $\Omega \cdot cm$. Therefore, when the gripped object is gripped, no chipping of the gripping portions 2 is caused and static electricity can be removed at a suitable speed.

As a result, when $Fe_2O_3$, $Cr_2O_3$, NiO and $Co_3O_4$ are used as conductivity giving agents, contents of these conductivity giving agents can be set to range from 10 to 35 weight %. When TiC, WC and TaC are used as conductivity giving agents and contents of these conductivity giving agents are set to range from 10 to 25 weight %, it is possible to obtain partially stabilized zirconia ceramics having a flexural strength 700 MPa or more and a volume specific resistance value from $10^6$ to $10^9$ Ω·cm. If the gripping portions 2 are formed by using these partially stabilized zirconia ceramics, it is possible to provide a gripper 1 in which a chipping amount of each of the gripping portions 2 is small and static electricity can be removed at a suitable speed.

The embodiment modes of the present invention will next be explained.

Figure 2:
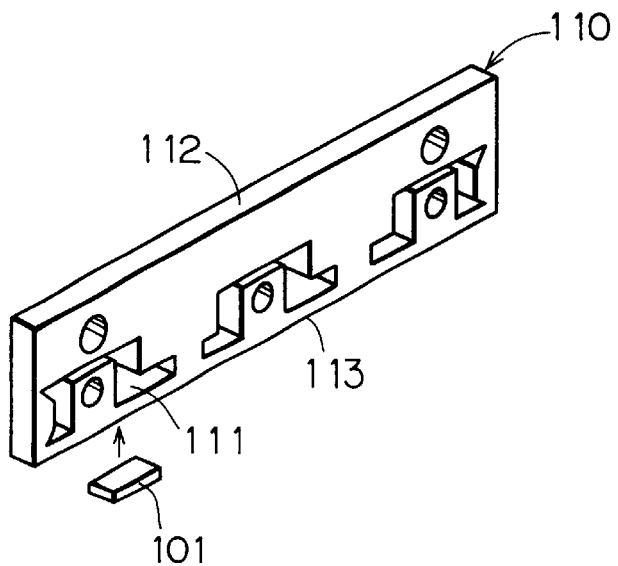
FIG. 2 is a perspective view of a jig in one embodiment mode of the present invention.
Figure 3:
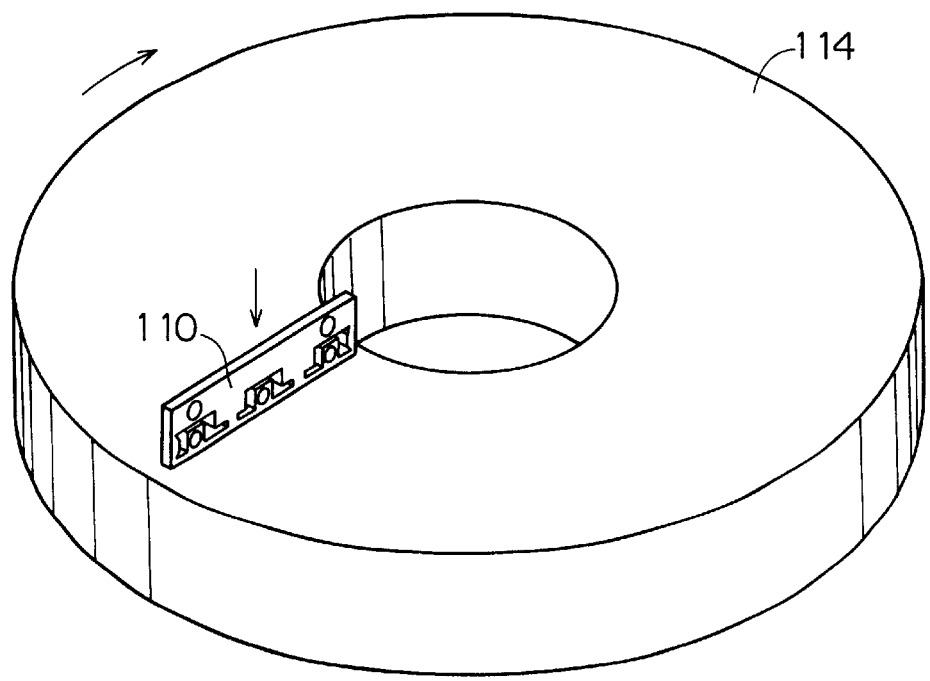
FIG. 3 is a perspective view of a polishing board.

A jig 110 shown in FIG. 2 is constructed by a plate-shaped body having a through hole 111 having a different shape and is used in a polishing process of a substrate 101 of $Al_2O_3$—TiC-including ceramics, etc. Namely, the side of an upper face 112 of the jig 110 is held in a state in which the substrate 101 is stuck to a lower face 113 of the jig 110. As shown in FIG. 3, when a rotating polishing board 114 is pushed toward the jig 110 and the jig 110 is polished, the substrate 101 can be resiliently pressed by the above through hole 111 so that a thickness of the substrate 101 can be uniformly adjusted.

The above jig 110 is formed by nonmagnetic ceramics having a volume specific resistance value from $10^6$ to $10^9$ Ω·cm.

Since the jig 110 has such a suitable volume specific resistance value, static electricity can be gradually discharged from the jig 110. Accordingly, a discharging action caused by atmospheric friction by discharging the static electricity at once is prevented and a bad influence of the discharging action on a magnetic head is prevented.

Here, when the volume specific resistance value of the jig 110 is excessively small, the static electricity is discharged at once and the discharging action is caused by the atmospheric friction so that the magnetic head is badly influenced by the discharging action. Therefore, in the present invention, the volume specific resistance value is controlled in a range of suitable conductivity from $10^6$ to $10^9$ Ω·cm so that the static electricity is gradually discharged. Accordingly, no magnetic head is easily badly influenced by the discharging action in the jig 10.

Further, if the volume specific resistance value is set to range from $10^6$ to $10^9$ Ω·cm as mentioned above, a treating accident caused by a conductive short circuit can be prevented. Further, the bad influence on the magnetic head can be prevented by using nonmagnetic ceramics. Further, the jig 110 is constructed by ceramics of high hardness so that a deterioration in accuracy of the jig 110 caused by hitting and wearing can be also prevented.

Another embodiment mode of the present invention will next be explained.

Figure 4:
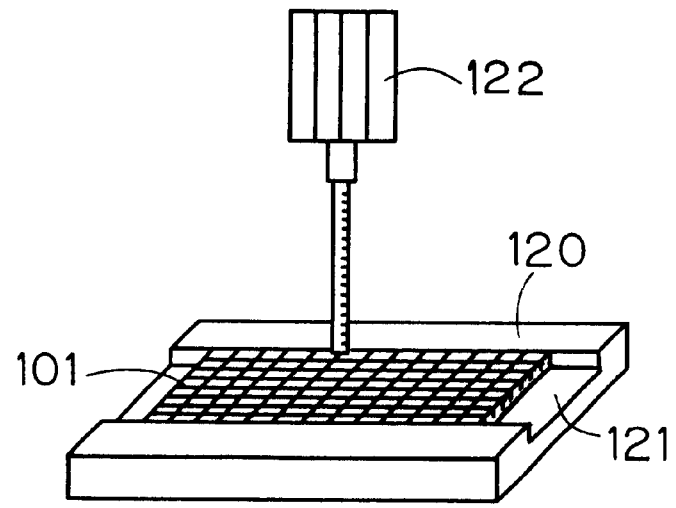
FIG. 4 is a perspective view of a jig in another embodiment mode of the present invention.

A jig 120 shown in FIG. 4 is constructed by a plate-shaped body formed by nonmagnetic ceramics having a volume specific resistance value from $10^6$ to $10^9$ Ω·cm and having a groove 121. A substrate 101 of an $Al_2O_3$—TiC-including sintering body is arranged on this groove 121 and can be processed by an ion milling machine 122 from an upper face of this substrate.

Figure 5:
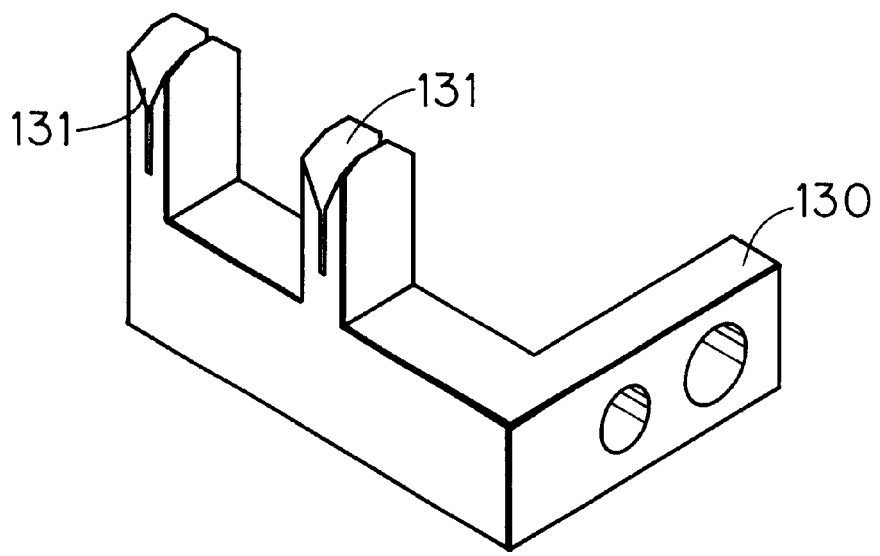
FIG. 5 is a perspective view of a jig in a still another embodiment mode of the present invention.

A jig 130 shown in FIG. 5 is constructed by nonmagnetic ceramics having a volume specific resistance value from $10^6$ to $10^9$ Ω·cm and has two slits 131, 131. When a manufactured magnetic head is assembled into a magnetic recorder, one portion of gimbals holding the magnetic head can be held by the above slits 131, 131.

The ceramics constituting these jigs 110 to 130 are preferably constructed by using the above-mentioned semiconductive zirconia sintering body.

Accordingly, the jig for processing and assembling the magnetic head in the present invention means a jig for holding a processed object in working processes of grinding, polishing, ion milling, etc. with respect to a ceramic material constituting the magnetic head, a jig, etc. for holding a head, etc. in an assembly process when the magnetic head is assembled or the obtained magnetic head is assembled into a magnetic recorder, etc.

The embodiment mode of the present invention will next be explained with a dynamic pressure bearing device of a spindle motor for a VTR as an example.

Figure 6:
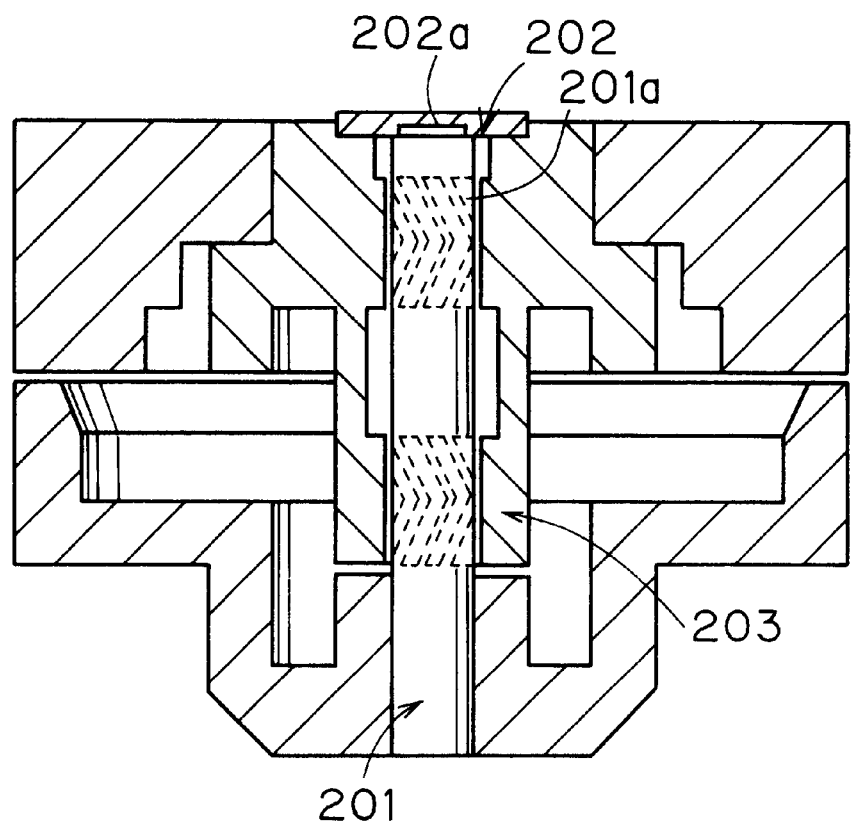
FIG. 6 is a longitudinal sectional view of a dynamic pressure bearing device of a spindle motor for a VTR in an embodiment mode of the present invention.

As shown in FIG. 6, a sleeve 203 is rotatably supported by a fixed shaft 201. A member connected to this sleeve 203 can be rotated around the shift 201 with high accuracy.

Figure 7:
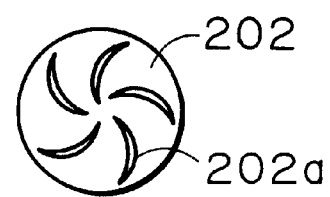
FIG. 7 is a view showing a power generating groove formed in a spiral shape on the surface of a bearing member in the present invention.

A dynamic pressure generating groove 201a is formed in a herringbone shape on a side of the above shaft 201, and a dynamic pressure bearing device in a radial direction is constructed between the dynamic pressure generating groove 201a and an inner circumferential face of the sleeve 203 constituting a bearing member. In contrast to this, a bearing member 202 in a thrust direction is arranged in a position opposed to an end face of the shaft 201. As shown in FIG. 7, a dynamic pressure generating groove 202a is formed in a spiral shape on a surface of this bearing member 202. The bearing member 202 and the dynamic pressure generating groove 202a constitute a dynamic pressure bearing device having thrust rigidity in the thrust direction by a pumping action of a lubricating fluid such as oil, gas, etc. at a rotating time.

The above bearing member 202 is constructed by zirconia ceramics having a volume specific resistance value from $10^5$ to $10^9$ Ω·cm and the dynamic pressure bearing device of the present invention is constructed between this bearing member 202 and the end face of the shaft 201.

In this dynamic pressure bearing device, the end face of the shaft 201 and the bearing member 202 come in contact with each other and are rotated at starting and stopping times and a low speed rotating time, and are floated and do not come in contact with each other at a high speed rotating time. When static electricity is caused in this contact rotation, this static electricity can be removed from the bearing member 202 at a suitable speed since the volume specific resistance value of the bearing member 202 ranges from $10^5$ to $10^9$ Ω·cm.

In the case of the above contact rotation, the bearing member 202 manufactured by the zirconia ceramics has an excellent sliding property with respect to the shaft 201 constructed by a metallic material, etc. so that a mutual wearing amount can be reduced.

Further, since the bearing member 202 manufactured by the zirconia ceramics has high strength and high fracture toughness, it is possible to prevent a damage fear of the bearing member 202 even when the bearing member 202 is mounted to a portable personal computer, etc. and a shock is applied to the bearing member 202.

The zirconia ceramics constituting the above bearing member 202 are preferably constructed by using the above-mentioned semiconductive zirconia sintering body. Concretely, 15 to 65 weight parts of one kind or more of oxides of Fe, Ni, Co, Cr, Nb and Sn as conductivity giving agents are included in the zirconia ceramics with respect to 100 weight % in total of $ZrO_2$ and a stabilizing agent as principal components.

The dynamic pressure bearing device of the present invention is not limited to the above spindle motor of the VTR, but can be used in various fields such as spindle motors of an FDD device, an HDD device and an LBP, etc. For example, when the dynamic pressure bearing device of the present invention is used in the spindle motor of the above VTR, the spindle motor is used at a rotating number about 3000 rpm. However, the rotating number is about 7000 rpm in the case of the HDD device. The rotating number is about 20000 rpm in the spindle motor of the LBP so that this spindle motor is used at a very high rotating speed.

At this time, the shaft 201 and the bearing member 202 are violently slid in a state in which loads are applied to the shaft 201 and the bearing member 202 at starting and stopping times. However, the bearing member 202 is constructed by a material having an excellent wear resisting property and an excellent sliding property so that a wearing amount of each of these members is reduced and these members can be preferably used for a long period.

Figure 8:
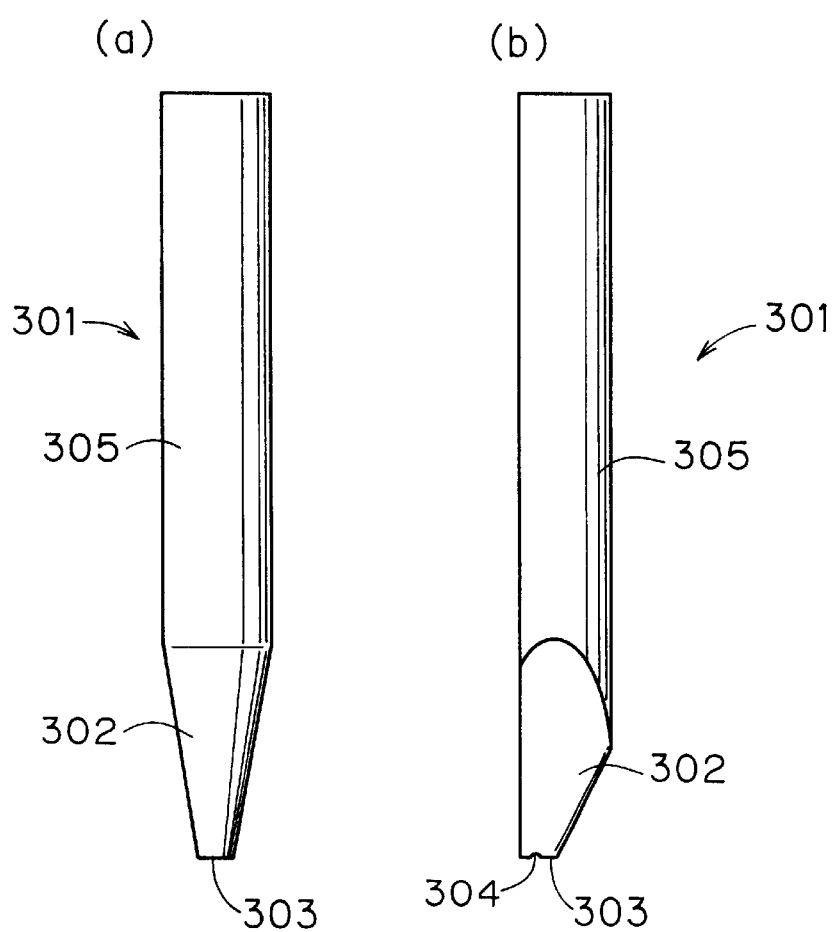
FIG. 8 is a view showing one embodiment mode of a wire bonding tool in the present invention in which FIG. 8(*a*) is a front view of the wire bonding tool and FIG. 8(*b*) is a side view of the wire bonding tool.
Figure 9:
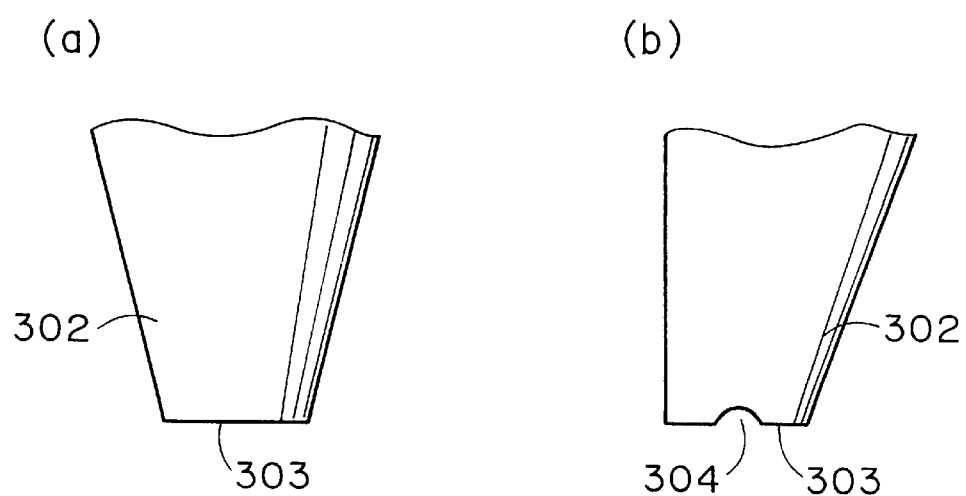
FIG. 9 is a view enlargedly showing an end tip portion of the wire bonding tool in the present invention in which FIG. 9(*a*) is a front view of the end tip portion and FIG. 9(*b*) is a side view of the end tip portion.
Figure 10:
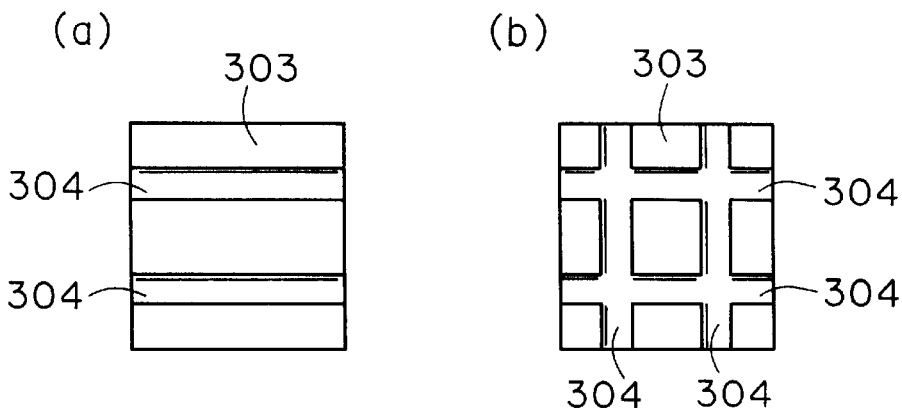
FIG. 10(*a*) is a bottom view showing two grooves formed in parallel with each other on an end tip face of the wire bonding tool, and FIG. 10(*b*) is a bottom view showing grooves formed in a checkerboard shape on the end tip face of the wire bonding tool.

FIG. 8 shows one embodiment mode of a wire bonding tool 301 in the present invention in which FIG. 8(a) is a front view of the wire bonding tool 301 and FIG. 8(b) is a side view of the wire bonding tool 301. FIG. 9 enlargedly shows an end tip portion 302 of the wire bonding tool 301 in which FIG. 9(a) is a front view of this end tip portion 302 and FIG. 9(b) is a side view of this end tip portion 302. This wire bonding tool 301 (hereinafter, called a bonding tool) is constructed by a body portion 305 and an end tip portion 302. The body portion 305 is approximately formed in a columnar shape and is notched on a plane in a longitudinal direction. The end tip portion 302 is drawn in a tapered shape from the body portion 305. A semicircular groove 304 is formed on an end tip face of this end tip portion 302 and extends from one side face of the end tip portion 302 to the other side face so as to increase pressing force at a press attaching time of a wire W. The groove 304 may have various patterns to increase the pressing force at the press attaching time of the wire W. For example, as shown in FIG. 10(a), two grooves 304 may be formed in parallel with each other. As shown in FIG. 10(b), the groove 304 may be also formed in a checkerboard shape. It is sufficient to form at least one groove 304 for increasing the pressing force at the press attaching time of the wire W.

Figure 11:
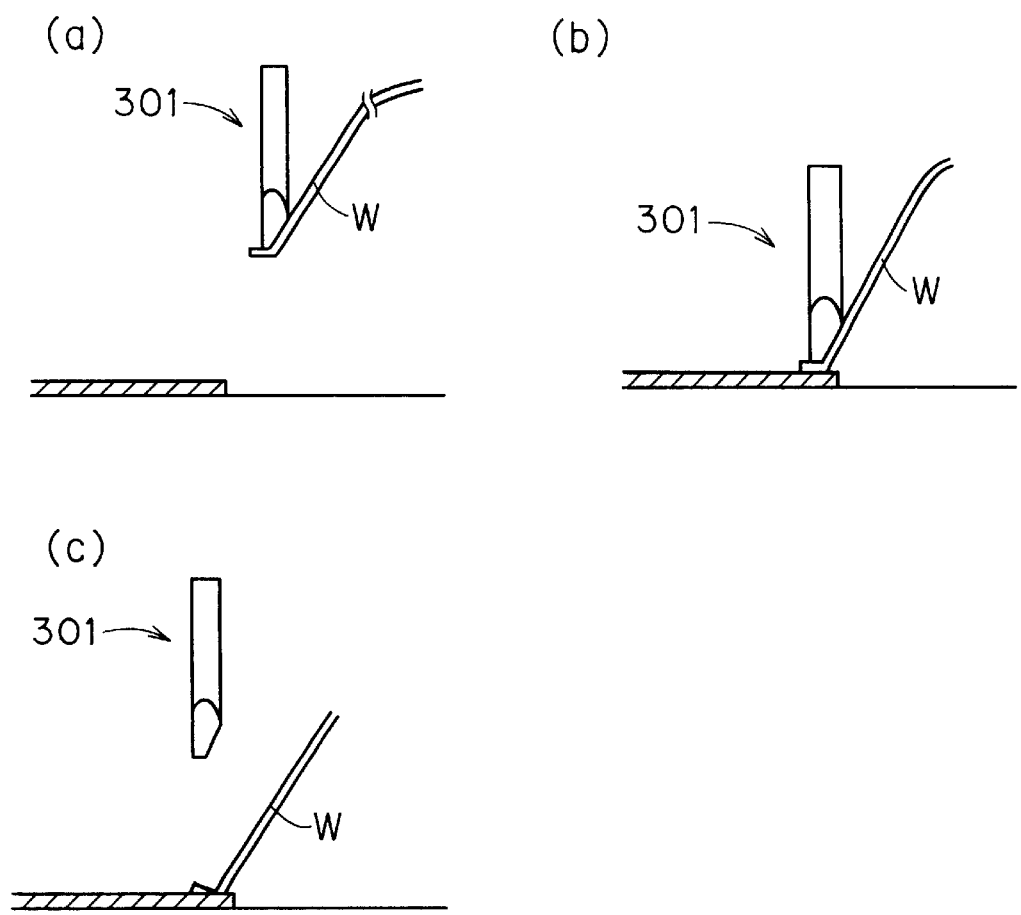
FIG. 11(*a*) is a side view showing that wire is guided until a predetermined joining position by the bonding tool, and FIG. 11(*b*) is a side view showing a state in which the wire is pressed against a predetermined position, and FIG. 11(*c*) is a side view showing a state in which the wire is pressed and attached in the predetermined joining position.

When the wire W is pressed and attached by this bonding tool 301, the wire W is first guided by the bonding tool 301 until a predetermined joining position as shown in FIG. 11(a). As shown in FIG. 11(b), the wire W is pressed in the predetermined joining position. Thereafter, while pressing force is applied to the wire W by the bonding tool 301, ultrasonic vibrations are applied to the wire W so that the wire W is strongly pressed and attached in the predetermined position as shown in FIG. 11(c).

This bonding tool 301 is entirely preferably formed by the above-mentioned semiconductive zirconia sintering body. Concretely, the entire bonding tool 301 is formed by partially stabilized zirconia ceramics including one kind or more of oxides of Fe, Cr, Ni and Co as conductivity giving agents, and having a fracture toughness value of the sintering body equal to or greater than 5 $MPam^{1/2}$ and a surface resistance value from $10^6$ to $10^9$ $\Omega \cdot cm$.

Thus, in the bonding tool 301 of the present invention, no edge portion of the groove 304 is chipped and cracked at a processing time of the groove 304 onto the end tip face 303 or in press attaching repetitions. Further, buildup of the wire W is small so that the wire W can be used for a long period. When static electricity is caused, the static electricity can be gradually escaped. Accordingly, no discharge is caused by atmospheric friction and a treating defective accident caused by a conductive short-circuit can be prevented and no wire W is magnetically charged since the wire W is nonmagnetic.

Therefore, when the bonding tool 301 of the present invention is used in a manufacturing process of a magnetic disk unit having an MR head and a GMR head, the bonding tool 301 has no bad influence on magnetic resistance elements of these heads and the wire W can strongly pressed and attached in a predetermined joining position. Further, a groove pattern of the bonding tool 301 is transferred to a press attaching face of the wire W so that a beautiful finishing face can be formed.

Figure 12:
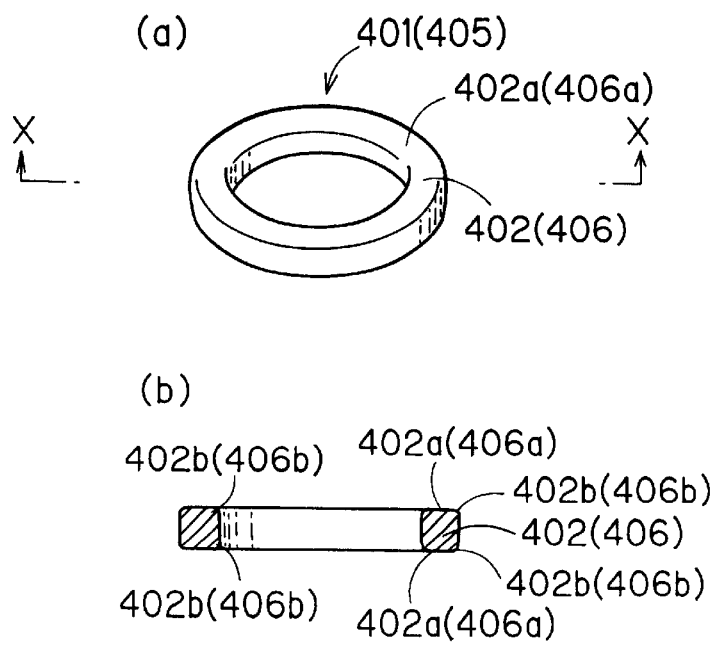
FIG. 12(*a*) is a perspective view showing a spacer as one example of a holding member for a substrate in the present invention, and FIG. 12(*b*) is a cross-sectional view taken along line X—X of FIG. 12(*a*).

FIG. 12 is a perspective view showing a spacer 401 (405) as one example of a holding member for a substrate in the present invention. A ring-shaped body 402 (406) is constructed by zirconia ceramics having a conductive property. Each of upper and lower faces of the ring-shaped body 402 (406) is set to a contact face 402a (406a) coming in contact with a magnetic disk substrate and a substrate for holding a magnetic head. This contact face 402a (406a) is set to have a flatness equal to or smaller than 3 μm, a central line average roughness (Ra) equal to or smaller than 2.0 μm, and a parallelism equal to or smaller than 3 μm. A chamfered portion 402b (406b) is formed in a tapered shape at each of inner and outer edges on the contact face 402a (406a). A size of the spacer 401 (405) is different in accordance with its using portion. For example, the spacer 401 for holding the magnetic disk substrate at a predetermined distance has an outside diameter from 6 to 40 mm, an inside diameter from 3 to 30 mm, and a thickness from 0.3 to 6 mm. The spacer 405 for holding the substrate for holding the magnetic head at a predetermined distance has an outside diameter from 3 to 20 mm, an inside diameter from 3 to 12 mm, and a thickness from 0.3 to 3 mm. A shape of the above chamfered portion 402b (406b) is not limited to the tapered shape, but may be set to a curved shape.

Figure 13:
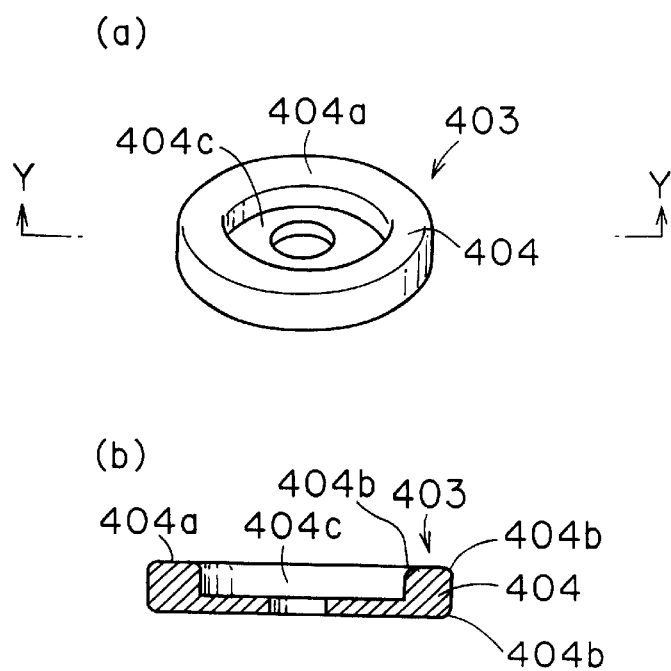
FIG. 13(*a*) is a perspective view showing a clamp as an example of the holding member for a substrate in the present invention, and FIG. 13(*b*) is a cross-sectional view taken along line Y—Y of FIG. 13(*a*).

FIG. 13 is a perspective view showing a clamp 403 as another example of the holding member for a substrate in the present invention. The clamp 403 is constructed by a disk-shaped body 404 formed by zirconia ceramics having a conductive property. In this figure, an upper face side of the disk-shaped body 404 is set to a contact face 404a coming in contact with the magnetic disk substrate. This contact face 404a is set to have a flatness equal to or smaller than 3 μm and a central line flat roughness (Ra) equal to or smaller than 2.0 μm so that the contact face 404a is set to a smooth face. A concave portion 404c engaged with an end tip of an unillustrated hub is formed at a center of the above contact face 404a. A chamfered portion 404b is formed in a tapered shape at each of inner and outer edges on the contact face 404a. A clamp 403 can have an outside diameter from 6 to 40 mm, an inside diameter from 3 to 30 mm, a thickness from 0.3 to 30 mm. A shape of the above chamfered portion 402b (406b) is not limited to the tapered shape, but may be set to a curved shape.

FIG. 14 shows a magnetic recorder using holding members of the spacer 401 (405), the clamp 403, etc. In this figure, the same portions as the conventional example are designated by the same reference numerals.

This magnetic recorder is constructed by a disk section 420 and a head section 430. In the disk section 420, plural magnetic disk substrates 425 and plural spacers 401 are alternately inserted into a hub 424 formed by a metal and fixed to a rotating shaft 423, and are pressed by a clamp 422 and are fixed to each other by fastening a screw 431. In the head section 430, plural substrates 427 for holding magnetic heads 426 and spacers 428 are alternately arranged. The magnetic heads 426 are respectively mounted to these substrates 427 and these substrates 427 are called head carriers. Both ends of the head section 430 are fixed by fixing members 429 called carrier arms. A magnetic disk substrate 405 of the disk section 420 is constructed by using a magnetic film formed on a surface of each of glass and sapphire substrates. The magnetic disk substrate 405 may be also constructed by forming a glace layer on a ceramic substrate such as alumina, etc. and forming a magnetic film on this glace layer. The substrates 427 for holding the magnetic heads and the fixing members 429 in the head section 430 are formed by aluminum.

In a state in which each magnetic disk substrate 425 is rotated by rotating the rotating shaft 423, each magnetic head 426 is moved while the magnetic head 426 is floated on the magnetic disk substrate 425 in a noncontact state. Thus, information is written and read in a predetermined position of each magnetic disk substrate 425.

In accordance with the present invention, the holding member such as the spacer 401 (405), the clamp 403, etc. is constructed by zirconia ceramics having high strength and high fracture toughness so that no holding member is deformed at fastening and fixing times. Further, since the contact faces 402a (406a) and 404a are flat and smooth, the magnetic disk substrate 425 and the substrate 427 for holding the magnetic head can be held with extremely high accuracy. There is a fear that heat is generated in the disk section 420 rotating at high speed. However, the spacer 401, the clamp 403 and the magnetic disk substrate 425 have small coefficients of thermal expansion and the differences in thermal expansion between these members are small so that the magnetic disk substrate 425 can be held with high accuracy as it is. Further, the spacer 405 of the head section 430 is also formed by ceramics so that the substrate 427 for holding the magnetic head can be also held with high accuracy. Therefore, a floating amount of the magnetic head 426 with respect to the magnetic disk substrate 425 can be extremely reduced so that a recording density can be improved.

The zirconia ceramics constituting the holding member such as the spacer 401 (405), the clamp 403, etc. have a conductive property so that static electricity can be escaped even when the magnetic disk substrate 425 and the magnetic head 426 are charged. Therefore, it is possible to prevent recording contents from being broken. Further, since the zirconia ceramics have small voids among ceramics and have high fracture toughness, chamfering amounts of the chamfering portions 402b (406b) and 404b formed at inner and outer edges can be reduced. Therefore, a contact area ratio of the magnetic disk substrate 425 and the substrate 427 for holding the magnetic head can be increased so that distortion of each of the magnetic disk substrate 425 and the substrate 427 for holding the magnetic head can be restrained. Further, when the magnetic disk substrate 425 is fastened and fixed and a shock is applied to the magnetic disk substrate 425, no grains and grinding waste almost drop to the magnetic disk substrate 425. Accordingly, when a magnetic resistance element such as an MR head, a GMR head, etc. is used as the magnetic head 426, no magnetic films on the magnetic head 426 and the magnetic disk substrate 425 are damaged so that a reliable magnetic recorder can be provided.

In the magnetic recorder of FIG. 14, the magnetic disk substrate 425 in an uppermost portion is held by the clamp 403 as an example. However, the magnetic disk substrate 425 in the uppermost portion may be held by the clamp 403 through the spacer 401. Further, in FIG. 14, the magnetic disk substrate 425 in a lowermost portion is held by a hub 424 through the spacer 401 as an example. However, the magnetic disk substrate 425 in the lowermost portion can be directly held by the hub 424. In this case, the hub 424 may be formed by ceramics having a conductive property. In the magnetic recorder of FIG. 14, the spacer 401 and the clamp 403 for holding the magnetic disk substrate 425, and the spacer 403 for holding the substrate 427 for holding the magnetic head are respectively formed by conductive zirconia ceramics as examples. However, for example, only the spacer 401 and the clamp 403 for holding the magnetic disk substrate 425, or only the spacer 403 for holding the substrate 427 for holding the magnetic head may be formed by conductive zirconia ceramics.

The holding member such as the above spacer 401 (405), the clamp 403, etc. is preferably formed by the above-mentioned semiconductive zirconia sintering body. Concretely, the semiconductive zirconia sintering body preferably has zirconia ($ZrO_2$) as a principal component, and includes one kind or more of oxides of Fe, Co, Ni and Cr as conductivity giving agents in a range from 10 to 50 weight %, and has a fracture toughness value ($K_{1c}$) of the zirconia ceramics equal to or greater than 5.0 MPam$^{1/2}$ and a volume specific resistance value equal to or smaller than $10^9$ Ω·cm.

What is claimed is:

1. A semiconductive zirconia body formed under oxidative conditions, comprising 60 to 90 weight % of $ZrO_2$ including stabilizing agent, said zirconia body having no more than 2% by weight $Al_2O_3$, containing greater than 10 weight % to 40 weight % of one kind or more of oxides of Fe, Co, Ni, and Cr as conductivity giving agents, having a three-point flexural strength of at least 580 Mpa, and having a volume specific resistance of $10^6$ to $10^9$ Ω·cm.

* * * * *